United States Patent
Basol et al.

(10) Patent No.: US 6,821,409 B2
(45) Date of Patent: Nov. 23, 2004

(54) ELECTROETCHING METHODS AND SYSTEMS USING CHEMICAL AND MECHANICAL INFLUENCE

(75) Inventors: Bulent M. Basol, Manhattan Beach, CA (US); Cyprian E. Uzoh, San Jose, CA (US); Paul Lindquist, Milpitas, CA (US); Homayoun Talieh, San Jose, CA (US)

(73) Assignee: ASM-Nutool, Inc., Milpitas, CA (US)

( * ) Notice: Subject to any disclaimer, the term of this patent is extended or adjusted under 35 U.S.C. 154(b) by 0 days.

(21) Appl. No.: 10/117,991

(22) Filed: Apr. 5, 2002

(65) Prior Publication Data

US 2003/0178319 A1 Sep. 25, 2003

Related U.S. Application Data

(60) Provisional application No. 60/282,202, filed on Apr. 6, 2001.

(51) Int. Cl.[7] .............................. B23H 3/08; C25F 7/00
(52) U.S. Cl. ...................... 205/640; 204/224; 205/662
(58) Field of Search ................................ 205/640, 662; 204/224, 224 R (56) References Cited

U.S. PATENT DOCUMENTS

| | | | | |
|---|---|---|---|---|
| 5,766,446 A | * | 6/1998 | Spindt et al. ............... | 205/640 |
| 6,451,698 B1 | * | 9/2002 | Au et al. .................... | 438/692 |
| 6,527,920 B1 | * | 3/2003 | Mayer et al. ............... | 204/237 |
| 2002/0088709 A1 | * | 7/2002 | Hongo et al. ............... | 205/640 |
| 2002/0139682 A1 | * | 10/2002 | Basol et al. ............ | 204/224 R |

* cited by examiner

Primary Examiner—Robert R. Koehler
(74) Attorney, Agent, or Firm—Pillsbury Winthrop LLP (57) ABSTRACT

The present invention applies an electrochemical etching solution to a material layer, preferably a metal layer, disposed on a workpiece, in the presence of a current. This electrochemical etching solution supplies to the material on the substrate surface the species to form an intermediate compound on the surface that can be more easily mechanically removed as intermediate compound fragments than the material. By removing the intermediate compound fragments, the process allows more efficient use of the supplied current to form another layer of intermediate compound that can also be mechanically removed, rather than using the current to result in another compound on the surface of the material that eventually dissolves into the solution. In another aspect of the invention, such intermediate compound particulates are externally generated and used to mechanically remove the surface layer of the material. Such intermediate particulates do not contaminate, and thus allow for more efficient material removal, as well as plating to occur within the same chamber, if desired.

40 Claims, 6 Drawing Sheets

ELECTROETCHING METHODS AND SYSTEMS USING CHEMICAL AND MECHANICAL INFLUENCE

This application relates to and claims priority from U.S. patent application Ser. No. 60/282,202 filed Apr. 6, 2001.

FIELD OF THE INVENTION

The present invention generally relates to semiconductor integrated circuit technology and, more particularly, to an electroetching process and apparatus to yield planar layers.

BACKGROUND OF THE INVENTION

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A conductive material filling process of such features, i.e., via openings, trenches, pads or contacts, can be carried out by electrodepositing a conductive material, such as copper, over the substrate including such features. There are many conventional electrodeposition methods and tools that deposit conformal layers of Cu on various substrates.

The importance of overcoming the various deficiencies of the conventional electrodeposition techniques, which deposit conformal coatings, is evidenced by technological developments directed to the deposition of planar copper layers. In such processes, a pad or a mask can be used during at least a portion of the electrodeposition process when there is physical contact or close proximity, and relative motion between the workpiece surface and the pad or the mask. For example, U.S. Pat. No. 6,176,992 to Talieh, entitled "Method and Apparatus for Electrochemical Mechanical Deposition" and commonly owned by the assignee of the present invention, describes in one aspect an electro chemical mechanical deposition technique (ECMD) that achieves deposition of the conductive material into the cavities on the substrate surface while minimizing deposition on the field regions by polishing the field regions with a pad as the conductive material is deposited, thus yielding planar copper deposits.

U.S. application Ser. No. 09/740,701 entitled "Plating Method and Apparatus that Creates a Differential Between Additive Disposed on a Top Surface and a Cavity Surface of a Workpiece Using an External Influence," also assigned to the same assignee as the present invention, describes in one aspect a method and apparatus for plating a conductive material onto the substrate by creating an external influence to cause a differential in additives to exist for a period of time between a top surface and a cavity surface of a workpiece. While the differential is maintained, power is applied between an anode and the substrate to cause greater relative plating of the cavity surface than the top surface.

U.S. application Ser. No. 09/735,546 entitled "Method and Apparatus For Making Electrical Contact To Wafer Surface for Full-Face Electroplating or Electropolishing," filed on Dec. 14, 2000 describes in one aspect a technique for providing full face electroplating or electropolishing or electroetching. And U.S. application Ser. No. 09/760,757 entitled "Method and Apparatus for Electrodeposition of Uniform Film with Minimal Edge Exclusion on Substrate," filed on Jan. 17, 2001 describes in one aspect a technique for forming a flat conductive layer on a semiconductor wafer surface without losing space on the surface for electrical contacts.

After depositing copper into the features on the semiconductor wafer surface using either planar deposition techniques or the conventional techniques, an electropolishing or a chemical mechanical polishing step (CMP) may be employed. These processes planarize the resulting surface, and if continued, the conductive material is removed off the field regions of the surface and left only within the features such as vias, contacts, trenches, bond pads etc. In the electro polishing, which is also referred to as "electrochemical etching" or "electroetching," both the material to be removed and a conductive electrode are dipped into the electro-polishing solution. Typically an anodic (positive) voltage is applied to the material to be removed with respect to the conductive electrode. With the applied voltage, the material is electrochemically dissolved and removed from the wafer surface.

Also, various other methods and apparatus, which attempt to improve the efficiency of the polishing process by combining electroetching with a CMP process step, exist. For example, U.S. Pat. No. 6,066,030, issued May 23, 2000 to Uzoh et al., generally employs a single device to carry out sequentially both CMP process and electroetching process of a substrate. The device includes a polishing head having a polishing pad and a cathode, which is arranged adjacent the polishing head while the anode is the substrate to be polished and electroetched. The electroetching process requires delivery of an etching or polishing solution to the substrate surface through the cathode while the tool is rotated and/or laterally moved across the substrate. The electroetching step is followed by the CMP process where a polishing slurry is introduced between the polishing pad and the substrate while the substrate is rotated.

To this end, however, there is need for alternative etching techniques that uniformly etches back conductive films. There is also a need for a process that yields planar surfaces.

SUMMARY OF THE INVENTION

It is an object of the present invention to provide an apparatus and process that can more efficiently etch a material deposited on a workpiece.

It is an object of the present invention to provide an apparatus and process that can more efficiently etch a metal deposited on a workpiece.

It is a further object of the invention to form at least one intermediate compound from a material layer of a workpiece such that the intermediate compound can be more easily mechanically removed than the material.

It is a still further object of the present invention to provide a method of introducing noncontaminating particulates to an electroetching or chemical mechanical etching process.

The above object of the invention, among others, either taken singly or in combination, are achieved by the method and apparatus according to the present invention. In one aspect the present invention applies an electrochemical etching solution to a material layer, preferably a metal layer, disposed on a workpiece, in the presence of a current. This electrochemical etching solution supplies to the material on the substrate surface the species to form an intermediate compound on the surface that can be more easily mechanically removed as intermediate compound fragments than the material. By removing the intermediate compound fragments, the process allows more efficient use of the supplied current to form another layer of intermediate compound that can also be mechanically removed, rather than using the current to result in another compound on the surface of the material that eventually dissolves into the solution.

Accordingly, raised surface portions of the material layer can be removed more quickly than surface portions within grooves or other cavities on the material layer, thus creating more efficient removal from the raised surface portions.

In another aspect of the invention, such intermediate compound particulates are externally generated and used to mechanically remove the surface layer of the material. Such intermediate particulates do not contaminate, and thus allow for more efficient material removal, as well as plating to occur within the same chamber, if desired.

BRIEF DESCRIPTION OF THE DRAWINGS

These and other aspects of an embodiment of the present invention are better understood by reading the following detailed description of the preferred embodiment, taken in conjunction with the accompanying drawings, in which.

DETAILED DESCRIPTION OF THE PRESENTLY PREFERRED EMBODIMENTS

As will be described below, the present invention provides a method and a system to selectively electrochemically etch a conductive material layer deposited on a surface of a semiconductor. The invention can be used with ECMD, other plating systems that yield planar deposits as well as other plating systems that deposit conformal films. The present invention achieves electro etching of the conductive material through the combination of the use of an etching solution and by contacting, sweeping and/or polishing of the conductive surface with a mask plate with abrasive surface.

Figure 1A:
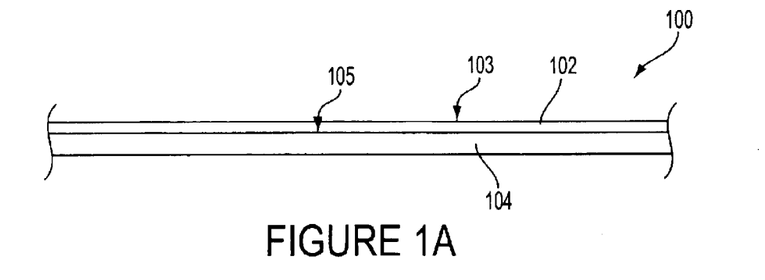
FIGS. 1A–1C shows cross-sectional views of a portion of a work piece at various levels of detail.
Figure 1B:
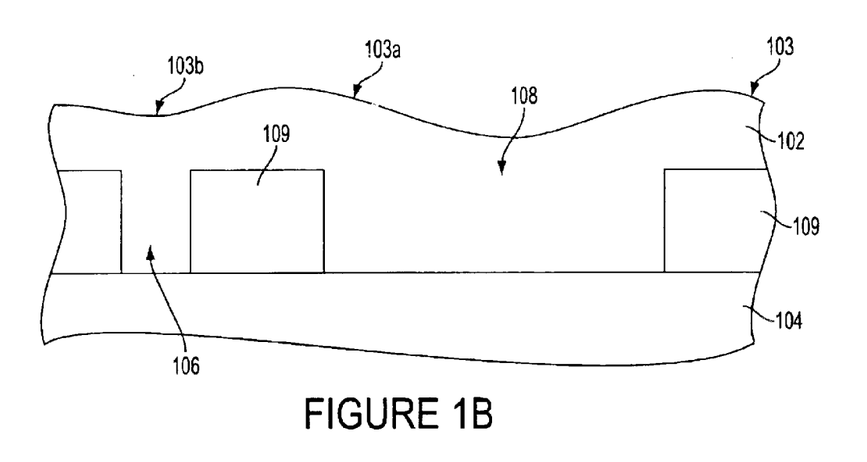
Figure 1C:
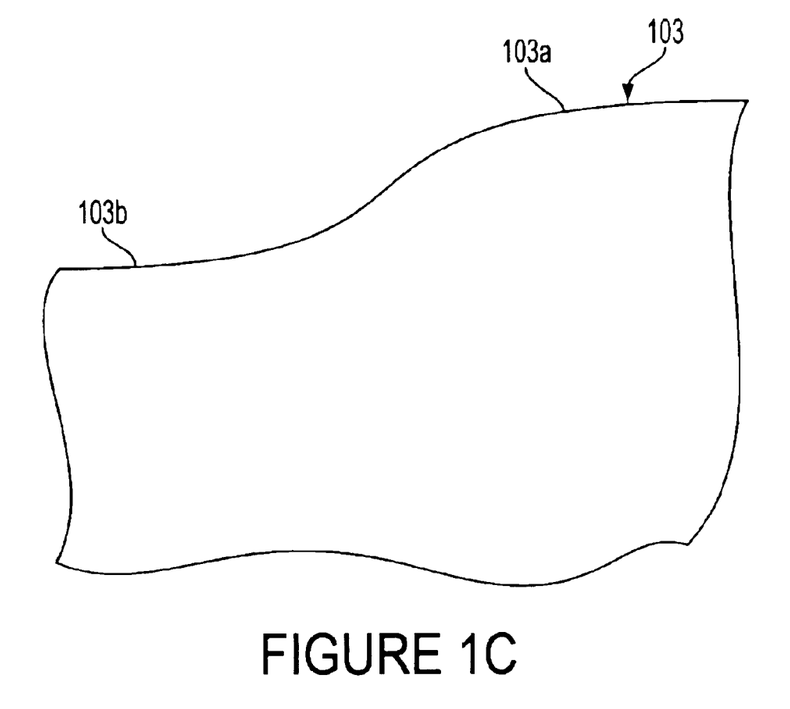

Reference will now be made to the drawings wherein like numerals refer to like parts throughout. FIG. 1A shows a cross-sectional view of a portion of a work piece 100, or a substrate, such as a portion of a semiconductor wafer. The substrate 100 comprises a top layer 102 having a top surface 103, a bottom layer 104 having an upper surface 105 upon which the top layer 102 formed. The top layer 102 of the substrate 100 may be comprised of a layer of conductive material and the bottom layer 104 may be comprised of a semiconductor material. In this embodiment, although the conductive layer 102 is formed on the substrate 100, it is within the scope of the present invention that the substrate 100 may be entirely formed from a conductive material. FIG. 1B is an enlarged partial cross-sectional view of near surface region of the substrate 100 (shown in FIG. 1A) which comprises a via feature 106 and a trench feature 108 formed in an insulating region 109 which is previously formed on the wafer surface. The substrate 100 may comprise a plurality of via, trench and other features. As illustrated in FIG. 1B, in order to exemplify one embodiment of the present invention the surface 103 of the conductive material layer 102 may not be planar, i.e., may have a surface topography having high and low regions formed during the deposition of the conductive layer. As shown in detail in FIG. 1C, accordingly, the surface 103 may have raised regions 103a and recessed regions 103b. It should be noted that the structure in FIG. 1B may contain barrier/glue layer, seed layers etc., which are commonly deposited on the substrate surface before the conductive layer is deposited.

Figure 2:
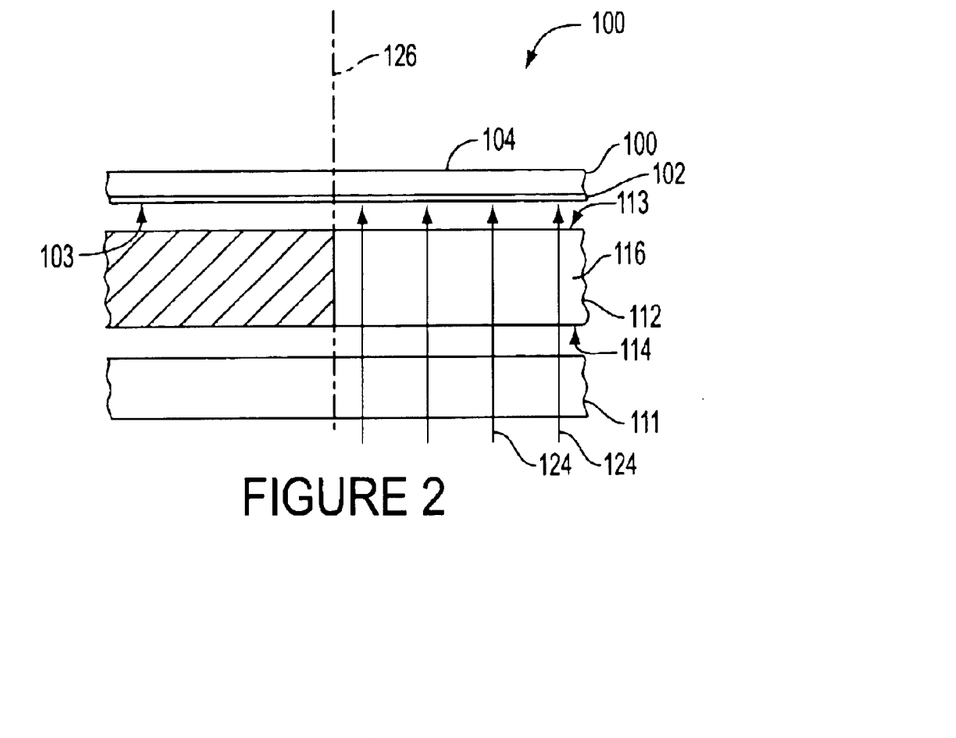
FIGS. 2–4 illustrate the an exemplary electroetching or electropolishing system according to the present invention.
Figure 3:
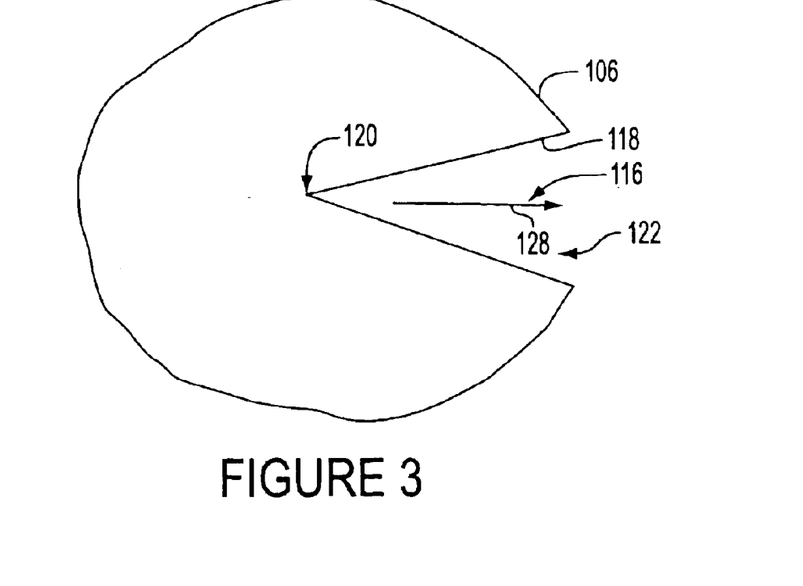
Figure 4:
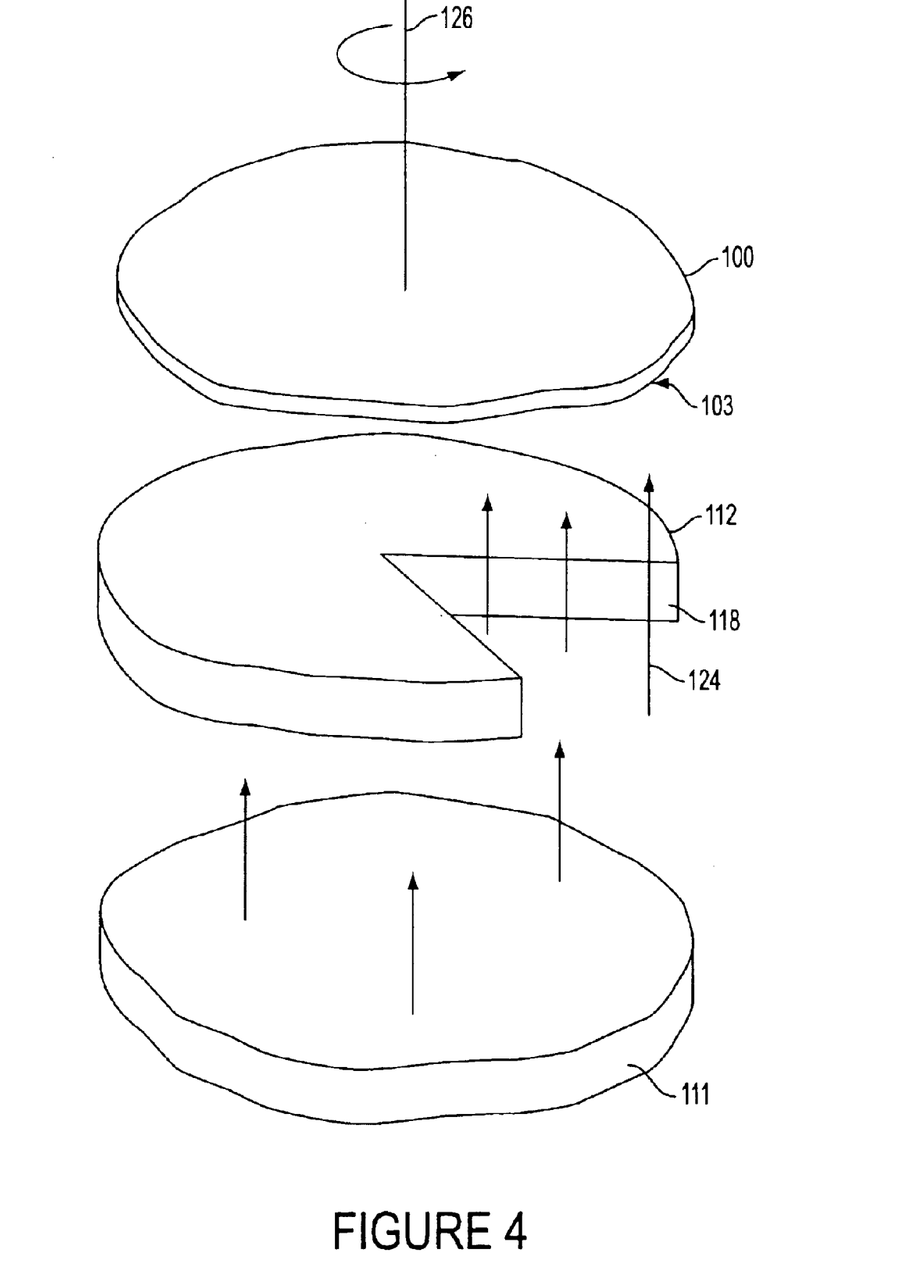

FIGS. 2–4 schematically show an exemplary electroetching or electropolishing system 110 of the present invention to etch the layer 102 of the substrate 100 in a planar fashion. The etching system 110 in this example embodiment has an electrode 111 and the substrate 100 and a mask plate portion 112. During the etching process of the present invention the conductive layer 102 is electrically connected, preferably with movable connectors, to a positive terminal of a power supply (not shown), and the electrode is connected to a negative terminal of a power supply. An etching solution, as depicted by arrows 124 touches the electrode 111 and the substrate 100 (see FIGS. 1A–1C). The substrate 100 is held by a carrier head (not shown) by the bottom layer 104. FIG. 3 exemplifies the mask plate portion 112 which may comprise a top surface 113 and a bottom surface 114. The mask plate 112 also comprises an exemplary channel 116 extending between the top and the bottom surfaces 113, 114 and defined by a 'V' shaped sidewall 118. The channel also laterally extends between a closed end 120 and an open end 122. The channels may be of various sizes and shapes. Holes or other asperities may also be used in place of channels, although channels are preferred. Channels and other asperities bring the etching solution in contact with the surface 102. They also control the etching rate at various parts of the substrate. For example the areas that are exposed the longest to the electrolyte through the asperities are expected to etch more during the etching process. Therefore, designing the openings in the mask plate 112 one can have more etching in the middle of a substrate, at the edge of the substrate or at any other specific place on the substrate. The etching rate can be graded throughout the substrate by grading the opening size and therefore the exposure time of the substrate surface to the electrolyte. IT should be noted that during electroetching, most or all of the etching current passes through the asperites in the mask plate 112 (depending on the distance between the mask plate and the substrate surface) and therefore removes material from the region on the substrate surface directly across from the asperity.

As will be described more fully below, during an etching process, when needed, the front surface 103 of the substrate 100 may be brought into close proximity, or contact with, the top surface 113 of the mask plate 112 for planar metal removal. The top surface of the mask plate is preferably abrasive or contains abrasive particles or features. As the etching solution 124, is delivered to the channel 116, the substrate 100 is rotated about a rotation axis 126 while the front surface 103 contacts the top surface 113 of the mask plate 112 or is in close proximity of the top surface 113. For the purpose of clarification, the rotation axis 126 may be the point at which the closed end 120 of the channel 116, thereby ensuring that rotation of the substrate 100 will result in the entire front surface 103 of the substrate 100 having uniform contact with the channel 116. As the solution 124 is delivered and fills the channel 116, it wets the front surface 103 of the substrate 100. The etching solution 124, which may be continuously delivered under pressure, will then flow through the channel 116 in the direction of the arrow 128 towards the open end 122 of the channel 116, and exits the plate 112.

It is noted that the above description described rotation and movement of the substrate 100, assuming that the plate 112 was stationary. It is understood that the system 100, as described above, will allow for either the substrate or the plate to move, or for both of them to move, thereby creating the same relative affect. For ease of description, however, the invention was above-described and will continue to be described in terms of movement of the substrate.

The process of the present invention may generally be described with the following example process. If the conductive material of the layer 102 is a metal 'A' which is formed of atoms of "A" (for example a conductive element atom in the periodic system of the elements, such as Cu, Ni, Ag, Sn, etc. or a conductive alloy). And, if the etching solution comprises a negatively charged ion, for example ion 'D$^{-m}$', such as halide ion i.e. Cl$^-$, Br$^-$ or I$^-$, (each being within Group VII of the periodic system of elements) or "RD$^{-m}$", where R represents an organic or inorganic group and RD$^{-n}$ is a complexed or adsorbed charged entity. Ion 'D' may have a single electron charge (n=1) and may be denoted as 'D$^-$' in the exemplary process.

Figure 5A:
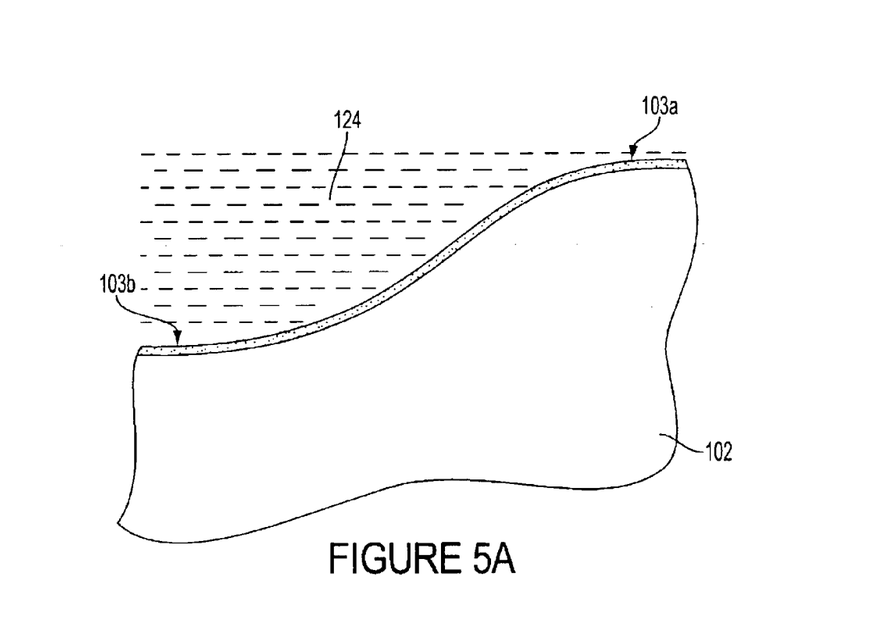
FIGS. 5A–5C illustrate the operation of the present invention on a workpiece.

As shown in FIG. 5A, as the solution 124, containing ion 'D$^-$', is delivered to the surface 103, due to the anodic voltage on the surface 103, 'D$^-$' ions in the solution 124 react with the 'A' atoms in the surface 103 and form a compound layer 130 across the surface 103 and hence on the regions 130a, 130b. Under above given conditions:

If a single ion 'D$^-$' reacts with 'A', a compound, denoted with, 'AD' forms. This requires one electron transfer. If the 'AD' compound is not soluble in the solution 124 or it is only slightly soluble it would momentarily suppress the etching process. The etch process may be continued by (1) transforming the 'AD' compound into a compound that can dissolve in the etching solution, and by (2) using the mechanical influence of the mask plate 112 to remove the compound layer from the surface 103 so that a new compound layer is formed in place of it.

The transformation of the 'AD' compound into a compound that may dissolve in the solution 124 may occur by attaching more than one D$^-$ ion to the AD compound. Since the compound is under anodic voltage, a reaction between the 'AD' compound and more 'D$^-$' ions in the solution may continue and the 'AD' compound on the surface may for example transform into 'AD$_x$' (x>1), where x denotes number of electrons transferred in the reaction and the number of 'D' atoms attached to the newly formed compound. If 'AD$_x$' compound is soluble in the etching solution, it dissolves from the surface and process repeats itself. Such etching of the layer 102 progresses across the surface 103 and may have an etch rate denoted with R1.

Figure 5B:
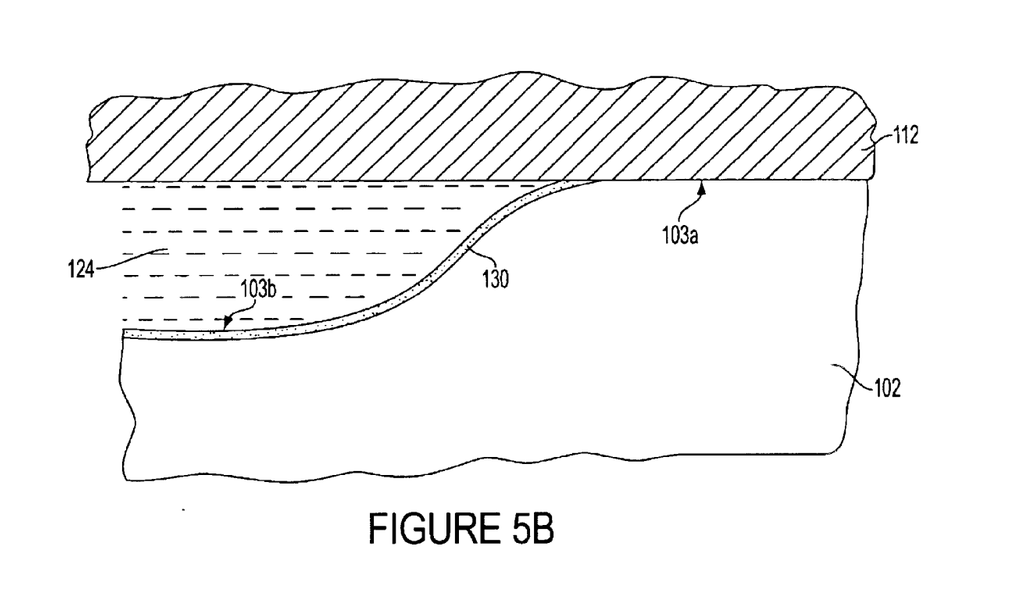

Meantime however, if the plate 112 is touched to the surface 103, which is illustrated in FIG. 5B, the mechanical influence of the mask plate 112 may physically dislodge the compound layer 130 in fragments from the raised regions 103a, even when it is in a chemical form that is not soluble in the etching solution, i.e as AD in our example. This results in removal of the raised regions 103a in a rate (R2) that is much faster than the etching rate (R1) of the recessed regions 103b, i.e., R2>R1. Because the portion of the compound layer 130 which covers the recessed regions 103b of the layer 102 cannot be readily affected from the mechanical influence of the mask plate 112, this portion of the compound layer remains untouched, and gets etched at the rate R1. Once the compound layer portion of the raised regions is removed, however, the 'AD' compound once again forms over the exposed A material surface of the layer 102, and process repeats itself.

Figure 5C:
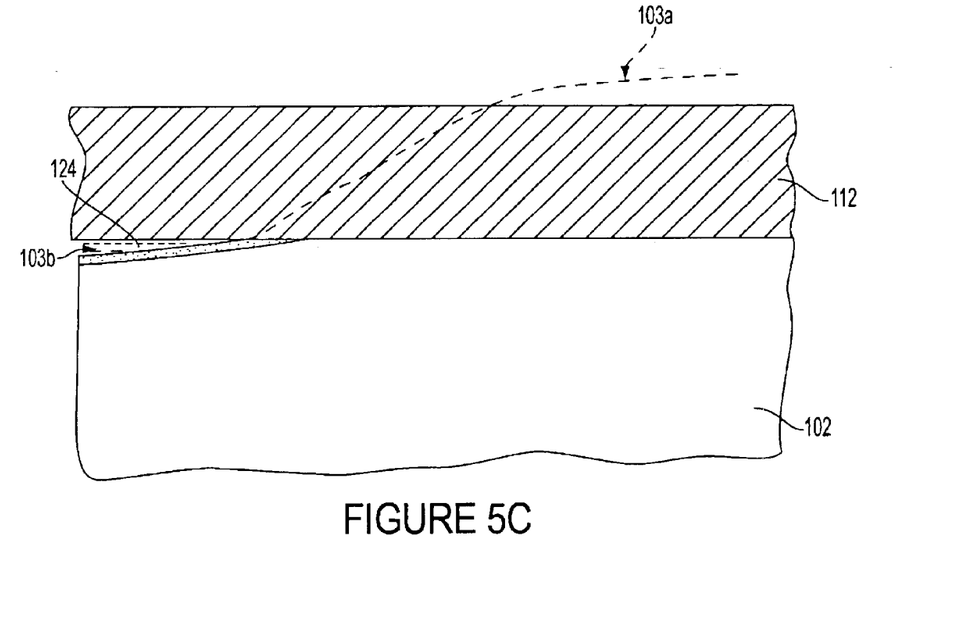

As shown in FIG. 5C, as the process of formation and then removal of the compound layer 130 on the raised regions 103a continue, the combination of both the slow etch rate across the recessed regions 103b and faster mechanical removal of the raised regions results in planarizing the layer 102. As the layer 102 planarized, the raised regions level with the recessed regions and the R2 etch rate becomes the controlling etch rate across the surface 103. Since the fragments of the compound layer 130 are less soluable than the compound layer 130, or not soluble at all, in the etching solution 124, they remain in the solution for at least a period of time and can thus additionally function as mild abrasives to assist polishing of the layer 102.

It should be noted that the above example used ions with one negative charge. The same process can use ions with differing charges. The condition is that there should be more than one electron transfer in the process and that intermediate compound(s) formed before the soluble compound is formed should be less soluble in the etching solution than the soluble compound.

EXAMPLE

An exemplary Cu etching solution may be an acid solution (such as sulfuric acid) comprising ionic species of copper (Cu$^{++}$), chlorine (Cl$^-$) and additives. In accordance with the principles of the present invention, when an anodic potential is applied to the substrate 100 with respect to the electrode 111, in the presence of the solution 124 that fills the channel 116, chlorine ions in the etching solution 124 reacts with the copper of the top layer 102 and forms a compound layer, which is a CuCl compound, on the top surface 103. Other additives in the bath may also participate in this reaction. This situation is exemplified in FIG. 5A which essentially shows the structure shown in FIG. 1C but with the addition of compound layer 130 which is formed as a result of a reaction between the copper and chlorine ions. The CuCl compound is not very soluble in the plating solution 124. Therefore, in this embodiment, CuCl compound is removed off the front surface 103 of the substrate by sweeping the compound layer 130 with the top surface 113 of the plate 112. This sweeping of the compound layer 130 with the plate 112 provides necessary mechanical influence to remove the compound layer 130 from the top layer 102. As the layer 130 is removed from the surface of the top layer 102, as illustrate in FIGS. 5B–5C, underlying surface which is under the compound layer 130 is exposed to the etch solution 124. As in the previous case, copper of the underlying surface, which is exposed after the removal of the compound layer 130, reacts with the chlorine ions in the solution 124 and forms a new compound layer containing CuCl. Accordingly, the steps forming of the CuCl layer and then the mechanical removal of it may be repeated until the copper layer 102 covering the field regions is removed. Because of the fact that the removed CuCl layer fragments are not very soluble in the etch solution, the such CuCl fragments function as mild abrasives enhancing polishing of the top layer 102. In this respect, the mechanical sweeping action results in forming an in-situ polishing slurry in the etching solution so that the copper layer 102 can be polished while being etched back.

If the plate 112 was not used then the CuCl would eventually transform into CuCl$_2$ and dissolve. CuCl$_2$ formation requires two electron transfer in comparison to CuCl formation that requires one electron transfer. This suggests that for the same amount of charge passing through the electroetching circuit during electroetching process, use of the mechanical action of the plate 112 would double the removal rate for a flat substrate compared to the case no mechanical action is required. For a non flat substrate, regions that are not affected by the mechanical action of the mask plate would etch slower through $CuCl_2$ formation, whereas the regions at the top that get affected etch faster through formation of CuCl and its physical removal.

It should be noted that the process can use a deposition solution as the electroetching solution also provided that the necessary species are contained in the solution. For example a sulfuric acid solution with Cu and Cl ions and other additives having similar such properties can be used to deposit Cu as well as to electroetch it using the method of this invention. This can be achieved in one machine by simply changing the polarity of the voltage applied between the anode and the cathode. And the deposition/electroetching processes can be repeated as many times as necessary.

In another embodiment the intermediate compound such as CuCl in the above example or other charge carrying complex may be supplied from another remote source where it is generated. Once generated it can be supplied to the surface of the substrate to aid the electroetching process. The insoluble or slightly soluble compounds of the substrate material to be removed are attractive polishing compounds for removing the substrate material because they do not scratch and damage the substrate surface. They are chemically very compatible with the substrate and the solution and therefore they do not contaminate. They can be continually generated as needed. They dissolve in the solution over time leaving no residues, therefore they are recyclable. The time of dissolution may vary from a few seconds to many minutes.

The preferred embodiments described above have been presented for purposes of explanation only, and the present invention should not be construed to be so limited. Variations on the present invention will become readily apparent to those skilled in the art after reading this description, and the present invention and appended claims are intended to encompass such variations as well.

What is claimed is:

1. A method of electrochemically removing a conductor of a top conductive surface of a workpiece, the method comprising the steps of:
   applying an electrochemical etching solution to the top conductive surface of the workpiece in the presence of a current, thereby causing a portion of the top conductive surface to form into an intermediate compound, the intermediate compound being more easily mechanically removed from the top conductive surface than the portion of the top conductive surface; and
   mechanically removing at least a portion of the intermediate compound from the top conductive surface.

2. The method according to claim 1 wherein the steps of applying and mechanically removing are repeated so that successive portions of the top conductive surface are formed and mechanically removed.

3. The method according to claim 2 wherein the step of mechanically removing removes a plurality of intermediate particulates that are each formed of the intermediate compound from different raised portions of the top conductive surface.

4. The method according to claim 3 wherein the top conductive surface includes raised portions and recessed portions, and the step of mechanically removing removes the intermediate particulates from the raised portions.

5. The method according to claim 3 further including the step of:
   causing the suspension of the intermediate particulates in the electrochemical etching solution; and
   using the particulates when mechanically removing the intermediate compound from the top conductive surface.

6. The method according to claim 5 further including the step of introducing externally generated intermediate particulates into the electrochemical etching solution from an external source for usage during the step of mechanically removing.

7. The method according to claim 6 further including the step of:
   continuing to apply the current to the electrochemical etching solution to cause at least some of the externally generated intermediate particulates to dissolve into the electrochemical etching solution.

8. The method according to claim 7 further including the step of performing an electrochemical mechanical deposition using the electrochemical etching solution and another current that has a polarity opposite the current prior to the step of applying.

9. The method according to claim 8 wherein the top conductive surface is copper.

10. The method according to claim 9 wherein the intermediate compound is CuCl.

11. The method according to claim 1 wherein the step of mechanically removing removes a plurality of intermediate particulates that are each formed of the intermediate compound from different raised portions of the top conductive surface.

12. The method according to claim 11 further including the step of:
    causing the suspension of the intermediate particulates in the electrochemical etching solution; and
    continuing to apply the current to the electrochemical etching solution to cause the intermediate particulates to dissolve into the electrochemical etching solution.

13. The method according to claim 1 wherein the top conductive surface includes raised portions and recessed portions, and the step of mechanically removing removes from the raised portions.

14. The method according to claim 1 further including the step of introducing externally generated intermediate particulates into the electrochemical etching solution from an external source for usage during the step of mechanically removing.

15. The method according to claim 14 further including the step of:
    continuing to apply the current to the electrochemical etching solution to cause at least some of the externally generated intermediate particulates to dissolve into the electrochemical etching solution.

16. The method according to claim 1 further including the step of performing an electrochemical mechanical deposition using the electrochemical etching solution and another current that has a polarity opposite the current prior to the step of applying.

17. The method according to claim 1 wherein the electrochemical etching solution applied in the step of applying includes a Group VII element therein.

18. The method according to claim 1 wherein the electrochemical etching solution applied in the step of applying includes Chlorine.

19. A method of removing a conductor of a top metal surface of a workpiece using an electrochemical etching solution and a plurality of particulates that are formed from an intermediate compound of the conductor, the method comprising the steps of:
    providing the plurality of particulates in suspension with the electrochemical etching solution to the top metal surface of the workpiece; and mechanically removing at least a portion of the conductor of the top metal surface using the plurality of particulates, the removed portion being in suspension with the electrochemical etching solution.

20. The method according to claim 19 further comprising the step of applying a current to the electrochemical etching solution while the step of mechanically removing takes place, thereby causing a portion of the top metal surface to form into the intermediate compound, the intermediate compound being more easily mechanically removed from the top metal surface than the portion of the top metal surface; and the step of mechanically removing removes at least a portion of the intermediate compound from the top metal surface.

21. The method according to claim 20 wherein the steps of providing, mechanically and applying are repeated so that successive portions of the top metal surface are formed and mechanically removed.

22. The method according to claim 21 wherein the step of applying is continued to further causes at least some of the intermediate compound to dissolve into the electrochemical etching solution.

23. The method according to claim 22 wherein the top metal surface includes raised portions and recessed portions, and the step of mechanically removing removes from the raised portions.

24. The method according to claim 23 further including the step of performing an electrochemical mechanical deposition using the electrochemical etching solution and another current that has a polarity opposite the current prior to the step of providing.

25. The method according to claim 24 wherein the top metal surface is copper.

26. The method according to claim 25 wherein the intermediate compound is CuCl.

27. The method according to claim 26 wherein the step of mechanically removing removes a plurality of intermediate particulates that are each formed of the intermediate compound from different raised portions of the top conductive surface.

28. The method according to claim 20 wherein the top metal surface includes raised portions and recessed portions, and the step of mechanically removing removes from the raised portions.

29. The method according to claim 28 wherein the top metal surface is copper.

30. The method according to claim 29 wherein the intermediate compound is CuCl.

31. The method according to claim 30 wherein the step of mechanically removing removes a plurality of intermediate particulates that are each formed of the intermediate compound from different raised portions of the top conductive surface.

32. The method according to claim 31 further including the step of performing an electrochemical mechanical deposition using the electrochemical etching solution and another current that has a polarity opposite the current prior to the step of providing.

33. The method according to claim 19 wherein the top metal surface includes raised portions and recessed portions, and the step of mechanically removing removes from the raised portions.

34. The method according to claim 33 wherein the top metal surface is copper.

35. The method according to claim 34 wherein the intermediate compound is CuCl.

36. An apparatus for electropolishing a workpiece having a top conductive layer using an electrochemical etching solution comprising:

an electrode that allows a potential difference to be applied between the electrode and the top conductive layer of the workpiece when the electrochemical etching solution is provided between the electrode and the top conductive layer of the workpiece such that the potential difference together with the electrochemical etching solution causes removal of the conductive material from the top conductive layer the workpiece and formation of an intermediate compound conductive layer of the workpiece; and a pad disposed to contact the top conductive layer of the workpiece, wherein:

movement of the pad relative to the workpiece while the contact is maintained and while applying the potential difference causes further removal of the intermediate compound from the top conductive layer of the workpiece.

37. An apparatus according to claim 36 wherein the electrode is connected to the pad.

38. An apparatus according to claim 37 further including means for introducing the solution.

39. An apparatus according to claim 38 wherein the means for introducing the solution introduces the electrochemical etching solution through the pad.

40. An apparatus according to claim 38 wherein the means for introducing the solution introduces the electrochemical etching solution directly to the workpiece.

* * * * *